United States Patent
Bandyopadhyay et al.

(10) Patent No.: US 9,405,881 B2
(45) Date of Patent: Aug. 2, 2016

(54) CYCLE ACCURATE STATE ANALYSIS WITH PROGRAMMABLE TRIGGER LOGIC

(71) Applicant: Cisco Technology, Inc., San Jose, CA (US)

(72) Inventors: Subhra Sundar Bandyopadhyay, Cupertino, CA (US); Jayanth Sankar Mekkoth, San Jose, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 14/577,804

(22) Filed: Dec. 19, 2014

(65) Prior Publication Data

US 2016/0180006 A1    Jun. 23, 2016

(51) Int. Cl.
*G06F 9/455*   (2006.01)
*G06F 17/50*   (2006.01)

(52) U.S. Cl.
CPC .................. *G06F 17/5081* (2013.01)

(58) Field of Classification Search
CPC .................................. G06F 17/5081
USPC ........................................ 716/112
See application file for complete search history.

(56) References Cited

U.S. PATENT DOCUMENTS

| | | | |
|---|---|---|---|
| 6,507,925 B1 | 1/2003 | Narayanan et al. | |
| 6,728,938 B2 | 4/2004 | Chang | |
| 6,880,113 B2 | 4/2005 | Anderson et al. | |
| 7,472,055 B2 * | 12/2008 | Garcia | G06F 17/5022 703/14 |
| 7,567,893 B2 * | 7/2009 | Torossian | G06F 17/5022 703/16 |
| 2015/0154093 A1 * | 6/2015 | Probyn | G06F 11/3089 714/37 |

OTHER PUBLICATIONS

Goel et al., "Hierarchical Data Invalidation Analysis for Scan-Based Debug on Multiple-Clock System Chips", ITC International Test Conference, 2002, pp. 1103-1110, Institute of Electrical and Electronics Engineers.

* cited by examiner

*Primary Examiner* — Suresh Memula
(74) *Attorney, Agent, or Firm* — Patterson & Sheridan, LLP

(57) ABSTRACT

In one embodiment, cycle-accurate information may be collected by stopping an input clock associated with a functional block of a SoC using a programmable trigger signal. The programmable trigger signal may also stops a root clock of the SoC. Cycle-accurate information may be collected regarding the functional block and at least one other functional block of the SoC at the time of the programmable trigger signal. The collected information may be outputted and used to debug the SoC in a time-efficient manner.

20 Claims, 4 Drawing Sheets

CYCLE ACCURATE STATE ANALYSIS WITH PROGRAMMABLE TRIGGER LOGIC

TECHNICAL FIELD

Embodiments presented in this disclosure generally relate to enhancing debugging capabilities of a System on a Chip (SoC). More specifically, embodiments disclosed relate to collecting information regarding the SoC at a time of a programmable trigger.

BACKGROUND

With the increased complexity of networking devices and protocols, it is increasing challenging to discover the source of a networking problem, especially when the problem occurs on a system on an application-specific integrated circuit (ASIC), such as an SoC. During SoC bring-up and board/system debugging, it is desirable to observe internal states of the SoC in an effort to determine a root cause of any issues. Design-for-debug (DFD) architectures are used during SoC bring-up and testing. For example, DFD may be used to observe internal nodes of the SoC for during functional debugging scenarios.

Due to increasing SoC complexity and decreasing time-to-market for SoC products, there exists a need for robust DFD architectures which support adequate testing of internal nodes in a time-efficient manner.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

One embodiment presented in this disclosure generally relates to a method for collecting cycle-accurate information based on a programmable trigger signal. The method generally includes stopping an input clock associated with a functional block of an SoC using a programmable trigger signal, wherein the programmable trigger signal also stops a root clock of the SoC, collecting information regarding the functional block and at least one other functional block of the SoC at the time of the programmable trigger signal, and outputting the information regarding the functional block and the at least one other functional block of the SoC at the time of the programmable trigger signal. The outputted information may be used to help debug the SoC.

Example Embodiments

Figure 1:
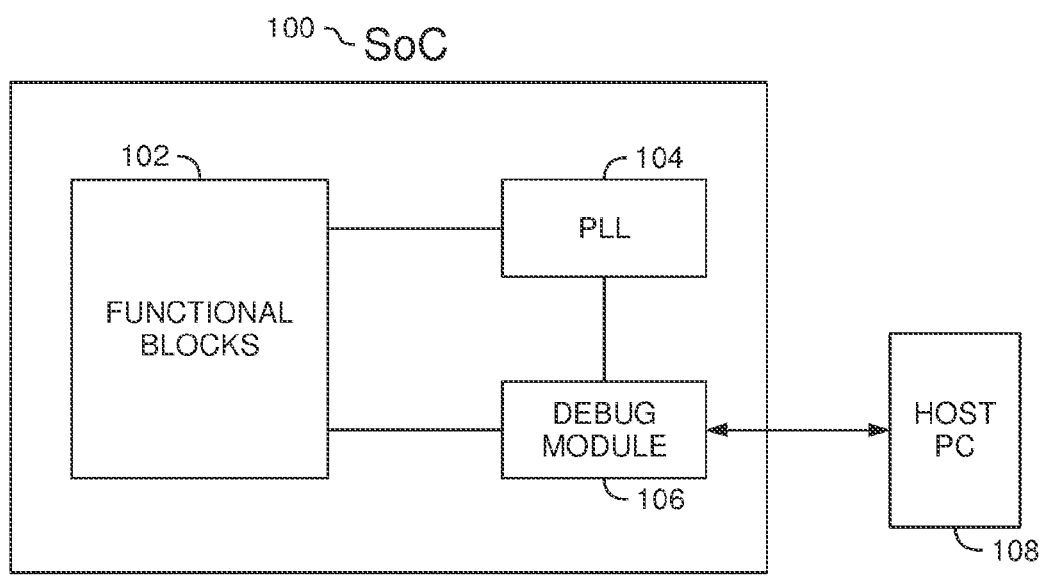
FIG. 1 illustrates an example SoC, according to aspects of the present disclosure.

FIG. 1 illustrates an example SoC 100, according to aspects of the present disclosure. An SoC 100 may implement a wide variety of functionality. For example, SoCs may be used to implement a Network on Chip (NoC), wherein the NoC links multiple SoCs, thereby improving the scalability and the power efficiency of complex SoCs.

The SoC may include one or more functional blocks (e.g., critical logic modules) 102, a phase lock loop (PLL) module 104, and a debug module 106 (e.g., Joint Test Action Group (JTAG) hub). The debug module 106 may allow various parameters to be "scanned out" of the SoC to an external host PC 108, to be used for debugging purposes.

Figure 4:
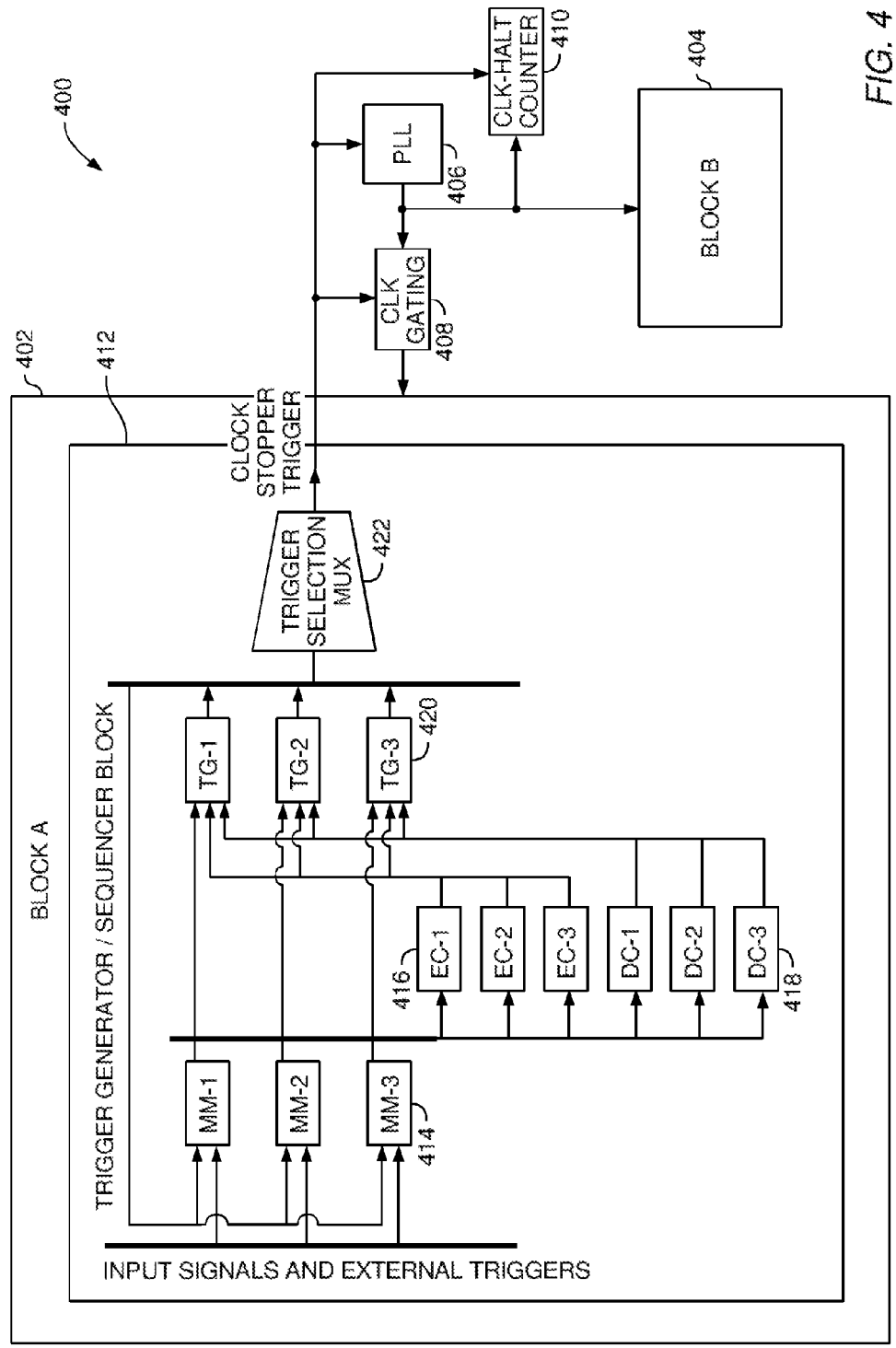
FIG. 4 illustrates an example SoC in which aspects of the present disclosure may be practiced.

Example components of the one or more functional blocks 102 are illustrated in more detail in FIG. 4. As described with reference to FIG. 4, the functional blocks 102 may include a trigger generator/sequencer block that may output a programmable trigger signal, which may stop various clocks in the SoC.

For example, the programmable trigger signal may stop a clock associated with a respective functional block, a root clock of the SoC, and clocks associated with one or more other functional blocks of the SoC. As described herein, stopping of these clocks by the programmable trigger signal may allow capturing cycle-accurate information of various functional blocks at the time of the programmable trigger signal (e.g., failure), in an effort to debug the SoC.

The PLL 104, which may drive a root clock of the SoC, may be used for synchronizing a plurality of clocks in the SoC. For example, each of the functional blocks 102 of the SoC 100 may be associated with a respective clock. The PLL 104 and root clock may provide signals that drive each respective clock. As will be described in more detail with reference to FIG. 2 and FIG. 4, the programmable trigger signal may stop the root clock and any number of other clocks, each of which are associated with a respective functional block of the SoC.

The functional blocks 102 and PLL 104 may be in communication with a debug module 106. The debug module 106 may include one or more ports (e.g., Joint Test Action Group (JTAG) ports) which output internal states of the functional blocks to, for example, an external host PC 108 (or some other type of CPU or interface) for analysis. For example, the internal states may be analyzed, with the aid of host PC 108, and used for debugging the SoC.

Embedded Logic Analyzer Module (ELAM) and scan chain based state value dumps are two examples of DFD architectures which may be used to debug an SoC 100. ELAM logic uses selected signals provided by users, including designers or debuggers, to capture and store data of interest for analysis purposes. For example, the selected signals may be input into one or more functional blocks 102 to capture cycle-state information at a time of failure. For scan chain based state value dumps (e.g., scan-dump), internal registers which may store a series of flop states of one or more functional blocks of interest (e.g., one or more of functional blocks 102), may be scanned out, via the host PC 108, and analyzed at a given point in time.

In an effort to accurately debug an SoC, a trigger signal may be generated and provided to a PLL module in order to stop a root clock of the SoC. For example, this trigger signal may be generated upon detection of one or more programmable trigger events. In this manner, internal states (e.g., of internal registers or flip-flops) of one or more functional bocks 102 of the SoC 100 may be observed.

However, due to the complexity and increasing dimensions of SoCs, logical components of an SoC may operate for several clock cycles, for example due to clock cycle leak, before the root clock may be reliably stopped at a source of the SoC. Further, several clock cycles may pass before a leaf node (e.g., at least one other functional block) of the SoC is affected by the trigger, for example, due to overall clock skews. This may lead to an increased time for debugging because the fail state may not be accurately latched in. Moreover, as modular designs for SoCs increase, internal states for each functional block of the chip at the time of the failure may not be necessary for determining functionality of the chip.

As will be described in more detail herein, a programmable trigger signal may be used to stop a local clock associated with a functional block (e.g., critical logic) being debugged. For example, the functional block may be stopped at a same time of a programmable trigger signal or after a fixed, predetermined amount of time after the programmable trigger signal, in an effort to capture cycle-accurate state information at the time of failure, thereby enhancing debug capability.

According to aspects, the programmable trigger signal, which may arrive from an existing, conventional functional trigger or from a conventional trigger generator may also stop a global, root clock of the SoC. Further, in addition to stopping the functional block under debug and the root clock, the programmable trigger signal may stop surrounding logic (e.g., one or more other functional blocks).

As will be described in more detail herein, one or more clock halt counters may be used to determine a cycle-accurate state of surrounding functional blocks of interest at the time of the programmable trigger signal. For example, the programmable trigger signal may initiate clock halt counters associated with one or more other functional blocks of interest. The clock halt counters may increment until they are stopped by the root clock (e.g., when the programmable trigger signal reaches the root clock). Based on how much each clock halt counter has advanced between the time of the failure and when it is stopped by the root clock, cycle-accurate information at the time of failure may be captured for each of the associated functional blocks of interest.

After the root clock is stopped, register data may be shifted out, using for example a slow speed scan clock. The register data may store a series of internal flip-flops associated with the one or more functional bocks of interest at the time of the failure. This register data may be scanned out, via the debug module 106, to the host PC 108, and may be used for debugging purposes.

Figure 2:
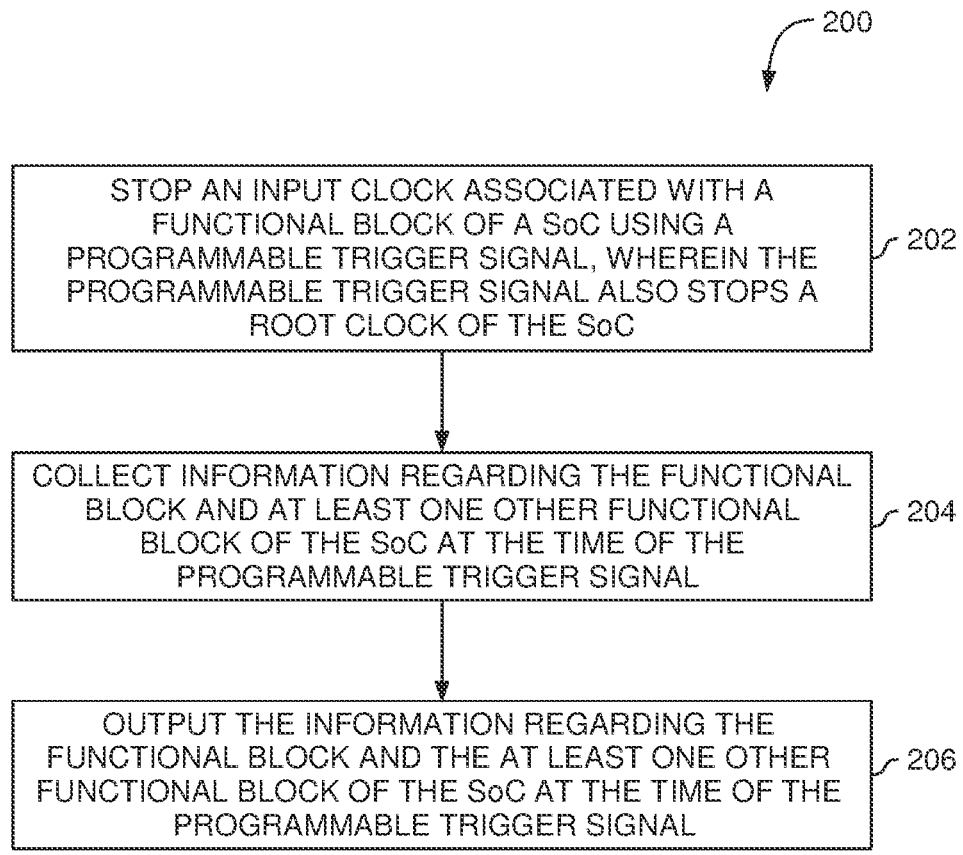
FIG. 2 illustrates operations which may be performed to collect cycle-accurate information with a programmable trigger, according to aspects of the present disclosure.

FIG. 2 illustrates example operations 200, performed to enhance debugging capabilities of an SoC. The operations may be performed, for example, by logic in one or more components of the SoC 100. As will be described in more detail herein, the operations may be performed by logic associated with the functional blocks 102, PLL 104, and debug module 106.

At 202, an input clock associated with a functional block of a SoC may be stopped using a programmable trigger signal. The programmable trigger signal may also stop a root clock of the SoC. The input clock associated with the functional block may be stopped in a same cycle as the programmable trigger signal. As will be described in more detail herein, the input clock may be stopped in a deterministic amount of time after the programmable trigger signal. The trigger generator/sequencer 302 of FIG. 3 and the trigger generator/sequencer block 412 of FIG. 4 may be used to stop an input clock of an associated functional block based on the programmable trigger signal. The programmable trigger signal may assert logic from the PLL 104 to stop the root clock of the SoC. According to aspects, the programmable trigger signal may also initiate one or more clock halt counters associated with other functional blocks of interest.

At 204, information at the time of the programmable trigger, regarding the functional block and at least one other functional block of the SoC, may be collected. The information may be collected via logic associated with the debug module 106 of the SoC 100. Collecting the information regarding the functional block and at least one other functional block may include determining how much a clock associated with the at least one other functional block has advanced after a root clock of the SoC is stopped by the programmable trigger signal.

According to an example, as described above, the programmable trigger signal may initiate a clock halt counter associated with at least one other functional block of interest. When the programmable trigger signal reaches the root clock, the root clock may stop the clock halt counter. Based on how much the clock halt counter has advanced, logic of the debug module 106 may capture cycle-accurate information regarding the associated functional block at the time of the programmable trigger signal.

At 206, information regarding the functional block and the at least one other functional block of the SoC at the time of the programmable trigger signal, may be output, to for example, a host PC. According to aspects, logic associated with the debug module 106 may be used to output the information.

Based, at least in part, on this cycle-accurate information at the time of failure, the SoC may be debugged. As described above, for example, one or more ports of the debug module 106 (e.g., JTAG ports) may be used to shift out cycle-accurate data and provide internal states regarding the functional blocks of interest at the time of the programmable trigger signal to an external PC host.

Figure 3:
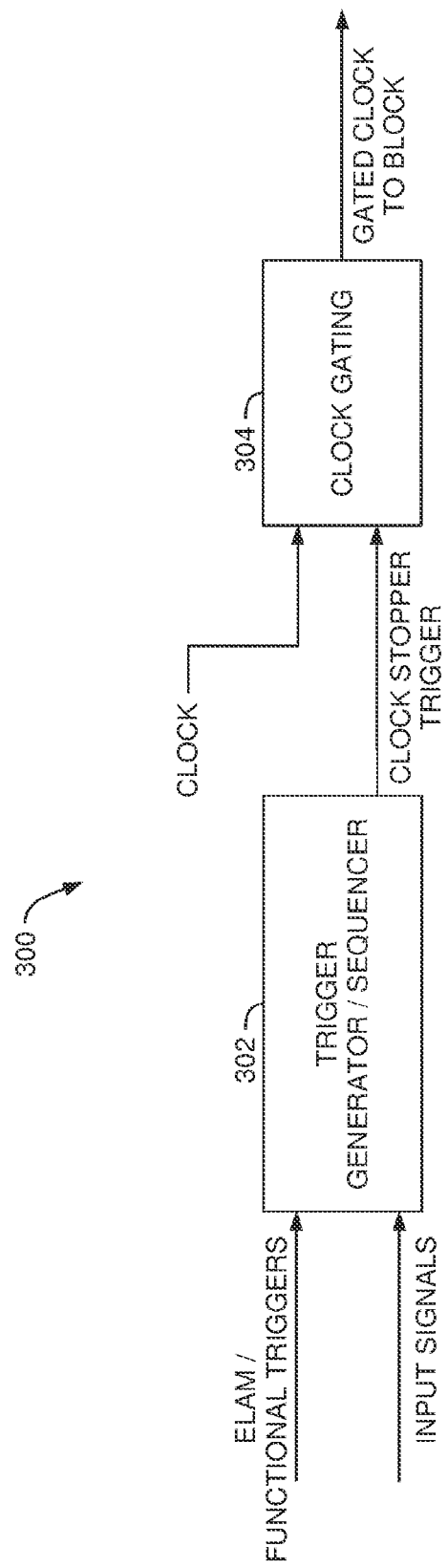
FIG. 3 illustrates example inputs and outputs of a trigger generator/sequencer module of a functional block, according to aspects of the present disclosure.

FIG. 3 illustrates an example block diagram 300 of inputs and outputs of a trigger generator/sequencer 302, according to aspects of the present disclosure. The trigger generator/sequencer 302 may be included, for example, in a functional block of a SoC. As illustrated, ELAM and/or other functional triggers, as well as other signals, may be input into the trigger generator/sequencer 302.

The trigger generator/sequencer 302 may process these inputs (e.g., to detect a programmable trigger event) and may output a clock stopping trigger (e.g., programmable trigger), which will be described in more detail with reference to FIG. 4. A clock signal and the programmable trigger signal may be input into a clock gating module 304. Based, at least in part, on these inputs, the clock gating module 304 may output a gated clock signal to one or more functional blocks of a SoC.

FIG. 4 illustrates an example SoC 400, in which embodiments of the present disclosure may be implemented. FIG. 4 illustrates two functional blocks of a SoC, Block A 402 and Block B 404. The SoC includes a PLL circuit 406, a clock gating module 408, and a clock halt counter 410. While only two functional blocks are illustrated, the SoC may include any number of functional blocks. According to aspects, additional, non-illustrated, functional blocks may be connected to a respective clock halt counter. Block A 402 and Block B 404 of FIG. 4 may be included the Functional Blocks 102 of FIG. 1 and PLL circuit 406 of FIG. 4 may include the the PLL module 104 of FIG. 1.

Block A 402 may include a trigger generator/sequencer block 412. The trigger generator/sequencer block 412 depicts additional details of the trigger generator/sequence block 302 illustrated FIG. 3.

In the example SoC 400, Bock A 402 and Block B 404 both receive a common clock signal from an output of the PLL circuit 406. As illustrated, a programmable trigger signal is generated from the trigger generator/sequencer block 412 of Block A 402. The programmable trigger signal may stop an input clock into Block A 402 in a same cycle. Further, the programmable trigger signal may start a clock halt counter 410 associated with Block B 404. While not illustrated, the programmable trigger signal may initiate a clock halt counter associated with one or more other functional blocks of the SoC as well. The programmable trigger signal may also eventually reach the PLL circuit 406, causing a root clock of the SoC to stop.

The clock halt counter 410, and optionally, other non-illustrated clock halt counters, may continue to increment until the root clock is stopped by the programmable trigger signal. In other words, the root clock may stop the clock halt trigger 410. Thus, the clock halt counter 410 provides information regarding how much a clock associated with Block B 404 has advanced since the time of failure (e.g., time of programmable trigger signal) at Bock A 402. In this manner, the clock halt counter 410 may reliably assist in determining a cycle-accurate representation for logic within associated functional Block B 404 at the time of failure, which may enhance debugging. The register data for various functional blocks including Block A 402 and Block B 404 may be analyzed and correlated to determine cycle-accurate information for debugging a SoC.

The trigger generator/sequencer block 412 may include one or more Mask and Match (MM) modules 414, Event Counter (EC) modules 416, Duration Counter (DC) modules 418, and Trigger Generator (TG) modules 420.

In some cases, a user may enter a trigger expression via a host PC (e.g., host PC 108 of FIG. 1) containing data fields in the form of a logical equation. The data fields associated with the trigger expressions may be stored in the one or more MM modules 414. Incoming data packets may be matched against the data fields stored in the MM modules 414. When a user-specified data pattern is detected, the MM modules 414 may begin a sequence to generate stop a clock stopping trigger for a respective functional block. MM modules 414 of the SoC 400 may support logically ANDing multiple input signals and/or opposite polarity (INV) matching.

EC modules 416 may receive input signals from the one or more MM modules 414. Two sets of counters may exist in the trigger generator/sequencer block 412. Reference counters may be programmed to a desired number of events and event counters may increment based on received input to match the one or more reference counters. Once a match is triggered, the EC module 416 may generate an output trigger signal.

DC modules 418 may receive inputs from the one or more MM modules 414 and may count a number of clock cycles after an event and/or trigger occurs. Two sets of counters may exist in the trigger generator/sequencer block 412. A reference counter may be programmed to a desired number of clock cycles and a duration counter may increment on every clock cycle after an event assertion to match the reference counter. Once a match is triggered, DC module 418 may generate an output signal.

TG modules 420 may receive inputs from the one more MM modules 414, EC modules 416, and DC modules 418. The trigger generator modules 414 may latch the value which will eventually reach a clock gating module 408 to stop the clock for Block A 402. Further, the one or more TG modules 420 may support a pass-through mode which may feed back to the one or more MM modules 414 to create complex sequences.

According to aspects, each of the MM modules 414, EC modules 416, DC modules 418, and TG modules 420 may have programmable operations in an effort to create complex sequences as described herein. For sake of illustration only, assuming that three triggers exist: A, B, and C, various programmable trigger signals may be generated by Block A as described below.

A trigger selection multiplexer 422 may receive inputs from the modules of the trigger generator/sequencer block 412. The multiplexer may output a signal to stop the clock associated with Block A 402. For example, a clock stopping trigger signal may be output from the trigger selection multiplexer 422 and may be input into the clock gating module 408. The clock gating module 408 may stop a clock associated with Block A 402 at a same time of the programmable trigger signal or at a deterministic amount of time after the programmable trigger signal. Further, the clock stopping trigger signal may eventually reach the PLL 406, and may cause a root clock of the SoC to stop. Stopping of the root clock may also stop clocks associated with one or more other functional blocks of the SoC (e.g., Block B 404).

As described above, an output of the trigger generator/sequencer block 412 may stop a clock associated with Block A 402 based on a combination of triggers. While three triggers, A, B, and C, are used for example purposes, one of ordinary skill in the art would understand that any number of triggers may be used, including more than three triggers, to support complex sequence trigger signal generation using the MM modules 414, EC modules 416, DC modules 418, and TG modules 420.

According to the above example, the clock associated with Block A 402 may be stopped, for example, when trigger A and trigger B occur together, N cycles after the occurrence of trigger B, when trigger A occurs and after M cycles trigger B occurs and after N cycles trigger C occurs, trigger A occurs N times followed by trigger B, trigger A occurs M times and after N cycles trigger B occurs, or trigger A occurs and sometime thereafter trigger B occurs.

These or other combination of triggers may assert the trigger generator/sequencer block 412 to stop a clock associated with Block A 402 using, for example, the clock gating module 304 as illustrated in FIG. 3. The clock associated with Block A 402 may be stopped at a same time of the trigger sequence or after a deterministic (e.g., fixed) amount of cycles decided by a user.

The trigger generator/sequence block 412 outputs a trigger to stop the clock associated with Block A 402. Eventually, the trigger will reach the global PLL 406 of the SoC to stop the root clock. Stopping the root clock of the SoC may, in turn, stop one or more other functional blocks of the SoC.

For example, the programmable trigger signal may initiate the clock halt counter 410 associated with Block B 404. Stopping of the root clock by the programmable trigger signal may stop the clock halt counter 410. In this manner, the clock halt counter 410 may assist in determining how much a clock associated with Block B has advanced since the time of the programmable trigger signal. Thus, the clock halt counter may assist in determining internal flop states, at the time of the failure, at Block B.

Information regarding specific functional blocks may be collected and outputted to an external PC to capture cycle-accurate data at a time of the failure in an effort to flexibly debug the SoC in a time-efficient manner.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described above with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality and operation of possible implementations of systems, methods and computer program products according to various embodiments. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

We claim:

1. A method, comprising:
   stopping an input clock associated with a functional block of a System on a Chip (SoC) using a programmable trigger signal, wherein the programmable trigger signal also stops a root clock of the SoC;
   collecting information regarding the functional block and at least one other functional block of the SoC at the time of the programmable trigger signal; and
   outputting, to host for analysis, the information regarding the functional block and the at least one other functional block of the SoC at the time of the programmable trigger signal.

2. The method of claim 1, wherein collecting the information for the at least one other functional block comprises:
   determining how much a clock associated with at the least one other functional block has advanced after the root clock is stopped.

3. The method of claim 1, further comprising:
   determining cycle-accurate information for the at least one other functional block at the time of the programmable trigger signal based on a counter associated with the at least one other functional block,
   wherein the counter is initiated by the programmable trigger signal and is stopped when the root clock is stopped.

4. The method of claim 1, wherein the programmable trigger signal stops the input clock associated with the functional block in a same cycle as the programmable trigger signal.

5. The method of claim 4, further comprising:
   determining how much the at least one other functional block has advanced since the programmable trigger signal using a counter associated with the at least one other functional block.

6. The method of claim 5, wherein the counter is stopped by the root clock.

7. The method of claim 1, wherein the input clock associated with the functional block is stopped in a deterministic amount of time after the programmable trigger signal.

8. Logic encoded in one or more non-transitory tangible media for execution and when executed operable to:
   stop an input clock associated with a functional block of a System on a Chip (SoC) using a programmable trigger signal, wherein the programmable trigger signal also stops a root clock of the SoC;
   collect information regarding the functional block and at least one other functional block of the SoC at the time of the programmable trigger; and
   output, to a host for analysis, the information regarding the functional block and the at least one other functional block of the SoC at the time of the programmable trigger signal.

9. The logic of claim 8, wherein collecting the information for the at least one other functional block comprises:
   determining how much a clock associated with at the least one other functional block has advanced after the root clock is stopped.

10. The logic of claim 8, further operable to:
    determine cycle-accurate information for the at least one other functional block at the time of the programmable trigger signal based on a counter associated with the at least one other functional block,
    wherein the counter is initiated by the programmable trigger signal and is stopped when the root clock is stopped.

11. The logic of claim 8, wherein the programmable trigger signal stops the input clock associated with the functional block in a same cycle as the programmable trigger signal.

12. The logic of claim 11, further operable to:
    determine how much the at least one other functional block has advanced since the programmable trigger signal using a counter associated with the at least one other functional block.

13. The logic of claim 12, wherein the counter is stopped by the root clock.

14. The logic of claim 8, wherein the input clock associated with the functional block is stopped in a deterministic amount of time after the programmable trigger signal.

15. An apparatus comprising:
    means for stopping an input clock associated with a functional block of a System on a Chip (SoC) using a programmable trigger signal, wherein the programmable trigger signal also stops a root clock of the SoC;
    means for collecting information regarding the functional block and at least one other functional block of the SoC at the time of the programmable trigger signal; and
    means for outputting, to a host for analysis, information regarding the functional block and the at least one other functional block of the SoC at the time of the programmable trigger signal.

16. The apparatus of claim 15, wherein the means for collecting the information for the at least one other functional block comprises:
    means for determining how much a clock associated with at the least one other functional block has advanced after the root clock is stopped.

17. The apparatus of claim 15, further comprising:
    means for determining cycle-accurate information for the at least one other functional block at the time of the programmable trigger signal based on a counter associated with the at least one other functional block,
    wherein the counter is initiated by the programmable trigger signal and is stopped when the root clock is stopped.

18. The apparatus of claim 8, wherein the programmable trigger signal stops the input clock associated with the functional block in a same cycle as the programmable trigger.

19. The logic of claim 15, further comprising:
    means for determining how much the at least one other functional block has advanced since the programmable trigger signal using a counter associated with the at least one other functional block, and wherein the counter is stopped by the root clock.

20. The apparatus of claim 15, wherein the input clock associated with the functional block is stopped in a deterministic amount of time after the programmable trigger signal.

* * * * *